US006847223B2

(12) United States Patent
Nara et al.

(10) Patent No.: US 6,847,223 B2
(45) Date of Patent: Jan. 25, 2005

(54) METHOD AND DEVICE FOR INSPECTION ACTIVE MATRIX SUBSTRATE

(75) Inventors: Shoji Nara, Yokohama (JP); Masatoshi Itoh, Fujisawa (JP); Makoto Ookuma, Yokohama (JP)

(73) Assignee: Wintest Corporation, Yokohama (JP)

( * ) Notice: Subject to any disclaimer, the term of this patent is extended or adjusted under 35 U.S.C. 154(b) by 0 days.

(21) Appl. No.: 10/779,567

(22) Filed: Feb. 13, 2004

(65) Prior Publication Data

US 2004/0217773 A1 Nov. 4, 2004

(30) Foreign Application Priority Data

Feb. 14, 2003 (JP) ....................................... 2003-036094

(51) Int. Cl.[7] ................................................ G01R 31/00
(52) U.S. Cl. .................................... 324/770; 324/158.1
(58) Field of Search .............................. 324/158.1, 770, 324/750, 753, 755, 737, 76.49; 438/30, 97

(56) References Cited

U.S. PATENT DOCUMENTS 5,428,300 A * 6/1995 Takahashi et al. .......... 324/770
5,539,326 A * 7/1996 Takahashi et al. .......... 324/770

FOREIGN PATENT DOCUMENTS

| | | |
|---|---|---|
| JP | 03-200121 | 9/1991 |
| JP | 05-288641 | 11/1993 |
| JP | 08-079634 | 3/1996 |
| JP | 08-184845 | 7/1996 |
| JP | 2000-147072 | 5/2000 |
| JP | 3191073 | 5/2001 |
| JP | 3203864 | 6/2001 |

* cited by examiner

*Primary Examiner*—Evan Pert
*Assistant Examiner*—Trung Q. Nguyen
(74) *Attorney, Agent, or Firm*—Harness, Dickey & Pierce, P.L.C.

(57) ABSTRACT

An active matrix substrate has a plurality of pixel drive cells, each of which includes a switching element and a capacitor. The capacitor is charged and discharged through the switching element, and a charging current based on a charge stored in the capacitor and a discharge current after discharging the capacitor are sampled. The charging current is sampled at a plurality of points on a time axis in consideration of the variation of the on-resistance of the switching element. Since the load on a path through which an inspection current (charging current or discharge current) flows depends on the position of the pixel drive cells, the wave height value between the charging current and the discharge current is calculated for each pixel drive cell based on the discharge current, and whether or not the pixel drive cell has a defect is determined based on the wave height value.

14 Claims, 7 Drawing Sheets

METHOD AND DEVICE FOR INSPECTION ACTIVE MATRIX SUBSTRATE

RELATED APPLICATIONS

Japanese Patent Application No. 2003-36094, filed on Feb. 14, 2003, is hereby incorporated by reference in its entirety.

BACKGROUND OF THE INVENTION

The present invention relates to a method and a device for inspecting an active matrix substrate.

In inspection of an active matrix type liquid crystal display device, there may be a case where a liquid crystal display device is inspected after filling the space between an active matrix substrate and an opposite substrate with a liquid crystal (Japanese Patent Application Laid-open No. 5-288641 (FIGS. 1 to 5), for example). In this case, if a defect is found even in one pixel of the liquid crystal display device, the entire device becomes defective.

Therefore, a method and a device for inspecting a liquid crystal display device in the stage of an active matrix substrate have been proposed (Japanese Patent No. 3203864 (FIGS. 1, 3, and 4) and Japanese Patent No. 3191073 (FIG. 4)). In the active matrix substrate, a pixel select switching element and a capacitor are provided for each pixel. This method and device determine whether or not the pixel has a defect by detecting a current based on a charge stored in the capacitor.

However, according to the inventions disclosed in Japanese Patent No. 3203864 and Japanese Patent No. 3191073, if the detection timing varies for characteristics of the waveform of the inspection current based on the charge stored in the capacitor of each pixel, there may be a case where a normal pixel is erroneously determined to have a defect.

BRIEF SUMMARY OF THE INVENTION

The inventors of the present invention have found that the peak value of the inspection current cannot be accurately measured due to variation in the on-resistance of the pixel select switching element for each pixel, even if a sampling pulse for sampling the inspection current is accurately generated.

The present invention may provide a method and a device for inspecting an active matrix substrate capable of accurately determining whether or not the pixel drive cells on the active matrix substrate have defects, even if there is variation in the on-resistance of the pixel select switching element.

According to one aspect of the present invention, there is provided a method of inspecting an active matrix substrate in which a plurality of pixel drive cells are arranged in a matrix, each of the pixel drive cells including a pixel select switching element and a capacitor connected to the pixel select switching element, the method comprising:

- sequentially charging and discharging the capacitors of the pixel drive cells;
- detecting a charging current at different points on a time axis, the charging current being based on charges stored in the capacitors by charging;
- detecting a discharge current from the capacitors after discharging; and
- determining whether or not each of the pixel drive cells has a defect, based on the charging current detected at the different points and the discharge current.

According to another aspect of the present invention, an inspection device for carrying out this method is provided.

In the method and the device of the present invention, a current based on a charge stored in the load from the capacitor of each of the pixel drive cells to a detection circuit is included in the charging current based on the charge stored in the capacitor. Therefore, the discharge current after discharging the capacitor is detected. Since the discharge current is the current based on the charge stored in the load from the capacitor of each of the pixel drive cells to the detection circuit, a pure charging current based on the charge stored in the capacitor can be detected by taking both the charging current and the discharge current into consideration, whereby defect determination accuracy is improved.

Moreover, the charging current is detected at different points on a time axis. Since the time constants of the pixel drive cells differ from each other due to variation of the on-resistances of the pixel select switching elements, the charge/discharge curves differ from each other. Therefore, if the charging current is sampled by using a constant sampling pulse, a peak value of the charging current may not be detected, for example.

The adverse influence of variation of the on-resistances is more effectively reduced by using the charging current detected at the different points on a time axis than the case of detecting the charging current at one point, whereby an erroneous determination can be reduced.

Note that the steps of detecting the charging current and the discharge current will do if the charging and discharge currents are eventually detected. The charging current and the discharge current may be detected after current-voltage conversion of each current, for example.

The step of detecting the charging current may include adding up charging currents detected at the different points on a time axis. In this case, the step of detecting the charging current may be performed by using a plurality of first sample/hold circuits driven by a plurality of first sampling pulses which go active at the different points on a time axis.

The step of detecting the discharge current may be performed by using a second sample/hold circuit driven by a second sampling pulse which goes active after discharging. In this case, the determining step may include comparing an output from a common output line of the first sample/hold circuits with an output from the second sample/hold circuit by using a comparison circuit, and sampling an output from the comparison circuit by using a third sample/hold circuit driven by a third sampling pulse which goes active at a timing later than the second sampling pulse.

The step of charging and discharging may be performed in one vertical scanning period.

Alternatively, the step of charging and discharging may be performed in a plurality of vertical scanning periods. In this case, the step of detecting the charging current may be performed at one of the different points in each of the vertical scanning periods; the step of detecting the discharge current may be performed once after discharging in each of the vertical scanning periods; and the determining step may include comparing the charging current with the discharge current in each of the vertical scanning periods.

Specifically, the step of detecting the charging current may be performed by using a first sample/hold circuit driven by first sampling pulses, the first sampling pulses in the vertical scanning periods being different from each other. The step of detecting the discharge current may be performed by using a second sample/hold circuit driven by a second sampling pulse which is common in the vertical scanning periods. The determining step may include comparing an output from the first sample/hold circuit with an output from the second sample/hold circuit in each of the vertical scanning periods by using a comparison circuit, and sampling an output from the comparison circuit by using a third sample/hold circuit driven by a third sampling pulse in each of the vertical scanning periods, the third sampling pulse going active at a timing later than the second sampling pulse.

The determining step may be performed based on a mean value of the comparison results obtained in the vertical scanning periods or based on a sum of the comparison results obtained in the vertical scanning periods. Alternatively, the determining step may be performed based on a maximum value selected from among the comparison results obtained in the vertical scanning periods.

The pixel select switching elements may be thin film transistors having various on-resistances in manufacturing.

DETAILED DESCRIPTION OF THE EMBODIMENTS

1. First Embodiment

A first embodiment of the present invention is described below with reference to the drawings.

Figure 1:
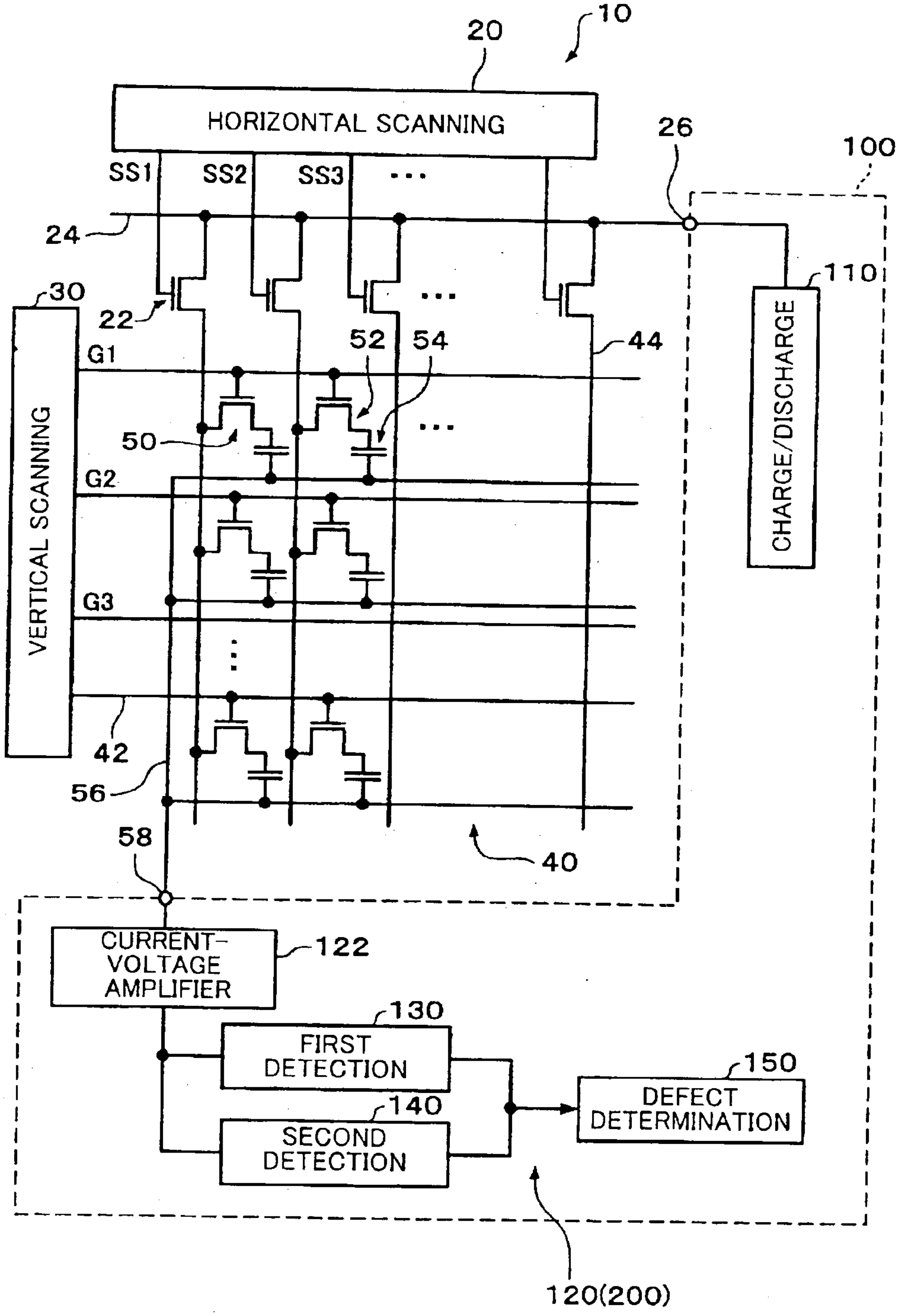
FIG. 1 is a diagram schematically showing an active matrix substrate and an inspection device according to the embodiments of the present invention.

As an example of the target of inspection, an active matrix substrate used for a liquid crystal display device is described below with reference to FIG. 1. In FIG. 1, a horizontal scanning circuit 20, a vertical scanning circuit 30, and an active matrix region 40 are formed on the active matrix substrate such as a glass substrate 10.

A plurality of scanning lines 42 extending in the horizontal direction and a plurality of signal lines 44 extending in the vertical direction are formed in the active matrix region 40. A plurality of pixel drive cells 50 are formed near the intersecting points of the scanning lines 42 and the signal lines 44. The pixel drive cell 50 includes a thin film transistor (TFT) 52 as a pixel select switching element, and a capacitor (storage capacitor) 54 connected with the thin film transistor 52. In FIG. 1, a plurality of pixel electrodes connected with the pixel drive cells 50 are omitted.

The thin film transistor 52 includes a source region, a drain region, and a channel region between the source region and the drain region in a polycrystalline silicon layer formed on the glass substrate by using either a low-temperature process or a high-temperature process. A gate is formed at a position which faces the channel region through a gate insulating layer. The on-resistance of the thin film transistor 52 varies in each pixel due to the manufacturing process.

The scanning line 42 is connected in common with the gates of the thin film transistors 52 in each row and functions as a gate line. The signal line 44 is connected in common with the sources of the thin film transistors 52 in each column and functions as a source line, for example.

Figure 2:
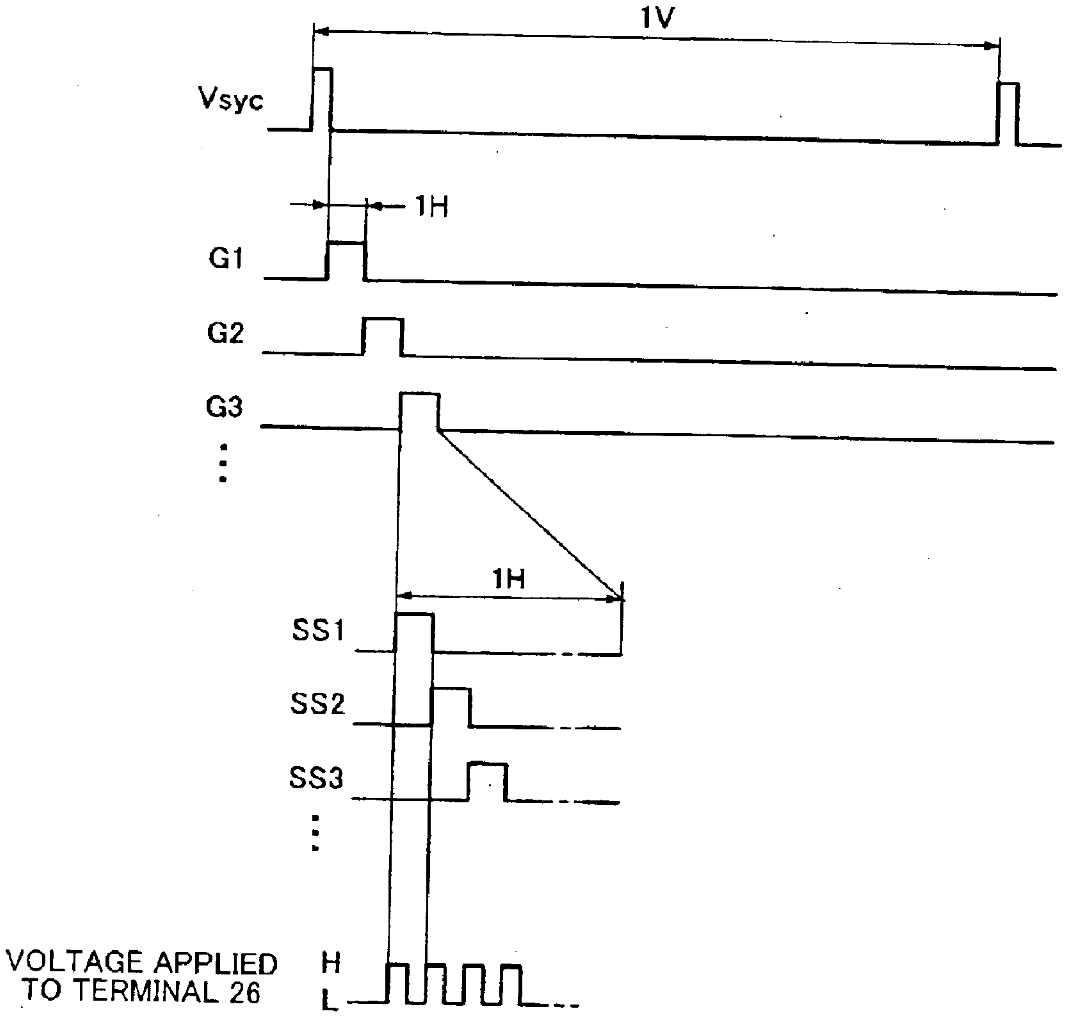
FIG. 2 is a timing chart illustrative of charge and discharge steps according to a first embodiment of the present invention.

As shown in FIG. 2, the vertical scanning circuit 30 outputs scanning signals G1, G2, G3, . . . , which supply an active potential to one of the scanning lines 42 and a non-active potential to the remaining scanning lines 42. As shown in FIG. 2, the vertical scanning circuit 30 sequentially scans the scanning lines 42 to which the active potential is supplied within one vertical scanning period (1V). When the active potential is supplied to one of the scanning lines 42, the thin film transistors 52 in one row connected in common with the scanning line 42 at the gates are turned ON at the same time.

A plurality of signal sampling switches 22 are connected with the signal lines 44 at one end. As shown in FIG. 2, the signal sampling switches 22 are sequentially turned ON within one horizontal scanning period (1H) by using timing signals SS1, SS2, SS3, . . . output from the horizontal scanning circuit 20, and dot-sequentially sample a signal on an image signal line 24. A signal input terminal 26 is provided at one end of the image signal line 24.

The capacitors 54 of the pixel drive cells 50 are connected in common with a common line 56, for example. An inspection terminal 58 is provided at one end of the common line 56.

As shown in FIG. 1, an inspection device 100 includes a charge/discharge circuit 110 connected with the signal input terminal 26. As shown in FIG. 2, the charge/discharge circuit 110 outputs a charge potential "H" and a discharge potential "L" in synchronization with the active period of each of the timing signals SS1, SS2, SS3, . . . output from the horizontal scanning circuit 20.

An inspection circuit 120 is connected with the inspection terminal 58. The inspection circuit 120 includes a current-voltage amplifier 122, first and second detection circuits 130 and 140, and a defect determination circuit 150. The current-voltage amplifier 122 is not necessarily provided. In this embodiment, the current-voltage amplifier 122 detects a signal from the pixel drive cell 50 after current-voltage conversion. The target of detection of the first and second detection circuits 130 and 140 is a voltage. However, the following description is given on the assumption that each of the first and second detection circuits 130 and 140 detects an inspection current (charging current or discharge current) which is converted into the voltage.

Figure 3:
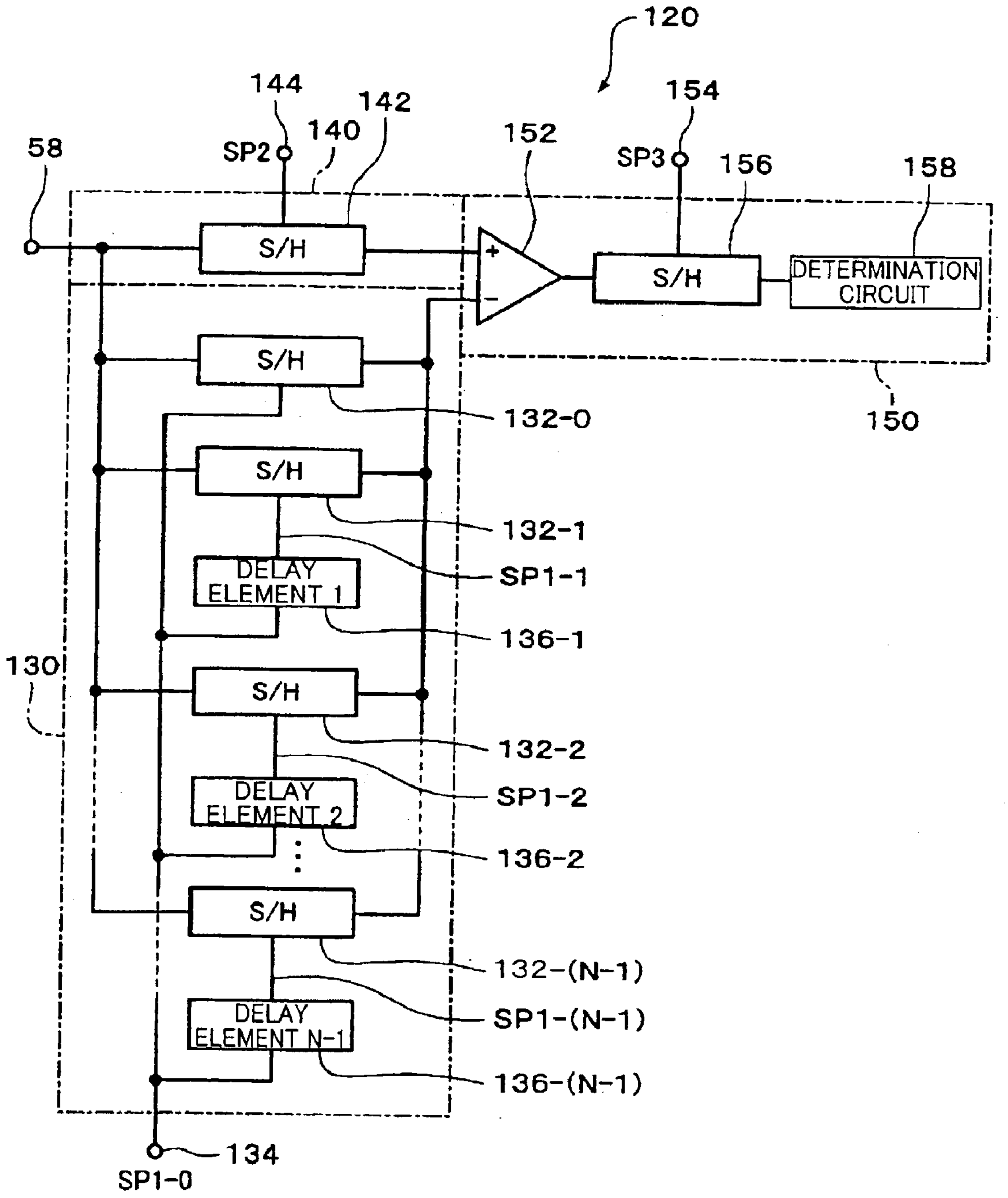
FIG. 3 is a block diagram showing an inspection circuit according to the first embodiment of the present invention.
Figure 4:
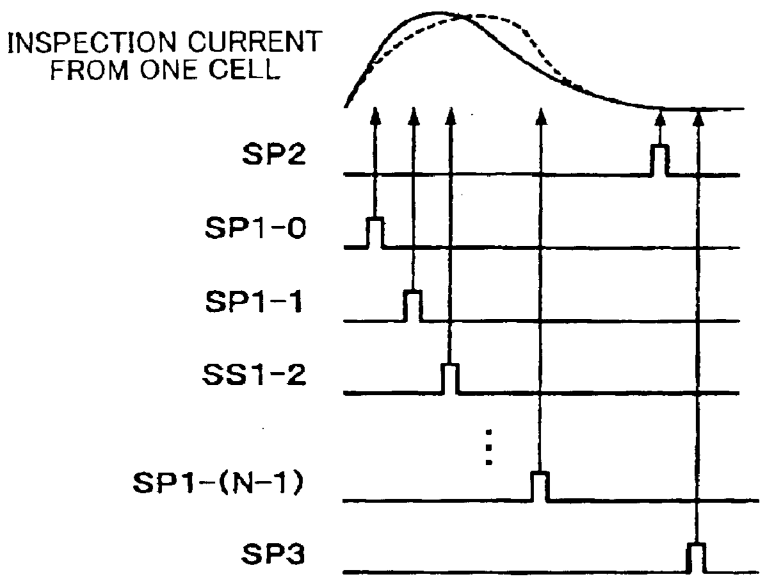
FIG. 4 is a chart showing the relationship between sampling pulses used in the inspection circuit shown in FIG. 3 and an inspection current waveform.

FIG. 3 shows a configuration example of the inspection circuit 120 connected with the inspection terminal 58 excluding the current-voltage amplifier 122. The first detection circuit 130 includes N first sample/hold (S/H) circuits 132-0 to 132-(N−1). The first detection circuit 130 includes an input terminal 134 to which a sampling pulse SP1-0 is input, and (N−1) delay elements 136-1 to 136-(N−1) connected in common with the input terminal 134. The outputs of the delay elements 136-1 to 136-(N−1) are respectively connected with the first sample/hold circuits 132-1 to 132-(N−1). The sampling pulses SP1-1 to SP1-(N−1) are generated by delaying the inputted sampling pulse SP1-0 by using the (N−1) delay elements 136-1 to 136-(N−1). FIG. 4 shows the sampling timing. As shown in FIG. 4, the sampling pulses SP1-0 to SP1-(N−1) are generated at even intervals. The sampling pulses SP1-0 to SP1-(N−1) are called first sampling pulses.

The second detection circuit 140 includes a second sample/hold circuit 142 and an input terminal 144 for a second sampling pulse SP2. The sampling timing of the second sampling pulse SP2 is as shown in FIG. 4.

The first sample/hold circuits 132-0 to 132-(N−1) and the second sample/hold circuit 142 are connected in parallel with the inspection terminal 58, and sample and hold the inspection current from the inspection terminal 58 at various types of sampling timing.

As shown in FIG. 3, the defect determination circuit 150 includes a comparator (comparison circuit) 152, an input terminal 154 for a third sampling pulse SP3, a third sample/hold circuit 156 which samples and holds the output from the comparator 152 at the third sampling pulse SP3, and a determination circuit 158. As shown in FIG. 4, the third sampling pulse SP3 is generated at a timing later than the second sampling pulse SP2.

The inspection device 100 according to the first embodiment measures all the pixel drive cells 50 on the active matrix substrate 10 within one vertical scanning period (1V) shown in FIG. 2. The inspection device 100 sequentially drives all the pixel drive cells 50 on the active matrix substrate 10 within one vertical scanning period to charge and discharge the capacitors 54 of the pixel drive cells 50.

As shown in FIG. 2, the scanning signal G1 output from the vertical scanning circuit 30 is set at HIGH (active potential) during one horizontal scanning period (1H). This causes all the thin film transistors 52 in the first row to be turned ON.

As shown in FIG. 2, the timing signals SS1, SS2, SS3, . . . , which sequentially go HIGH within one horizontal scanning period (1H), are output from the horizontal scanning circuit 20. This causes the voltage from the charge/discharge circuit 110 to be applied to the capacitors 54 of the pixel drive cells 50 in the first row through the corresponding thin film transistors 52.

As shown in FIG. 2, the voltage from the charge/discharge circuit 110 changes from HIGH to LOW within the active period of each of the timing signals SS1, SS2, SS3, . . . . Therefore, the capacitors 54 of the pixel drive cells 50 in the first row are sequentially charged by the application of the voltage HIGH and discharged by the application of the voltage LOW within one horizontal scanning period (1H).

The capacitors 54 of all the pixel drive cells 50 are charged and discharged within one vertical scanning period (1V) by repeating the above-described operation each time the scanning line 42 is scanned in the vertical direction by the scanning signals G1, G2, G3, . . . output from the vertical scanning circuit 30. This embodiment determines whether or not the pixel drive cell 50 has a defect by detecting the current based on the charge stored in the capacitor 54 after charging and discharging through the inspection terminal 58.

Figure 5A:
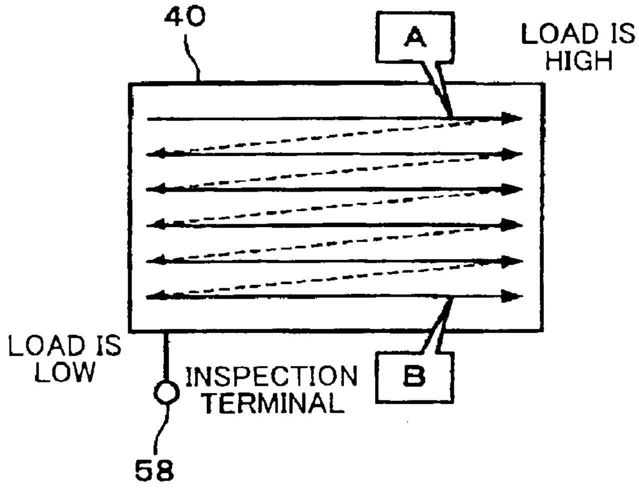
FIG. 5A is a diagram showing the load dependent on the distance between an inspection terminal and a horizontal scanning position.
Figure 5B:
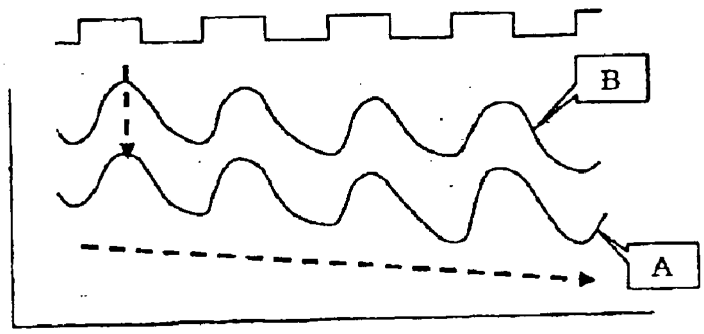
FIG. 5B is a chart showing an inspection current which changes depending on the amount of load.

The following first to third points should be given attention relating to defect determination of the pixel drive cell 50. The first point is that the current which flows through the inspection terminal 58 shown in FIG. 1 changes depending on the load (interconnect resistance, interconnect capacitance) between the capacitor 54 as the inspection target and the inspection terminal 58. FIGS. 5A and 5B show an example in which the detected current value decreases as the load increases, and the detected current value increases as the load decreases.

Therefore, since the absolute value of the charging current differs depending on the position of the pixel drive cell 50, it is necessary to prevent erroneous determination by detecting the difference between the maximum value of the charging current and the minimum value of the discharge current for each of the pixel drive cells 50.

Figure 6:
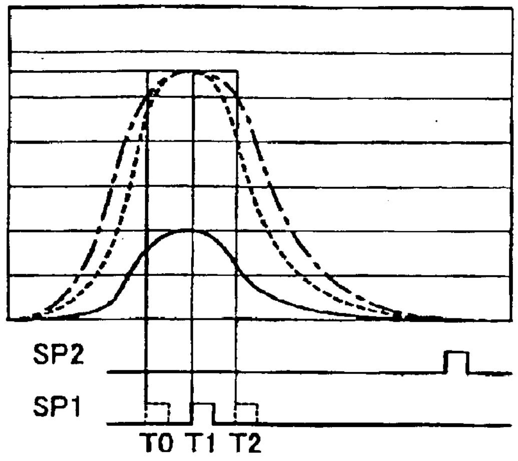
FIG. 6 is a chart showing the relationship between various inspection current waveforms and sampling pulses.

The second point is the importance of the sampling timing for sampling and holding the detected current from the inspection terminal 58. FIG. 6 shows the relationship between three types of detected current and three types of sampling timing. If the detected current can be sampled at a proper sampling timing T1, the peak value can be detected for all three types of detected current. However, if the sampling timing is shifted from the time T1 to time T0 or T2 before or after the time T1, a value far smaller than the peak value is detected for the detected current indicated by a solid line (when capacitance of the capacitor 54 is small) and for the detected current indicated by a dashed line (peak is sharp) in comparison with the detected current indicated by a dash-dotted line (capacitance of the capacitor 54 is large and the current peak is not sharp), thereby resulting in an erroneous determination.

The third point relates to the second point. Specifically, the charge/discharge characteristics of the capacitors 54 of the pixel drive cells 50 are not necessarily the same due to variation of the on-resistance of the thin film transistors 52. This may result in the erroneous determination pointed out with reference to FIG. 6. For example, if the on-resistance of the thin film transistor 52 is high, the peak of the charge/discharge curve is shifted from the peak of the charge/discharge curve indicated by a solid line in FIG. 4, as indicated by a dotted line. Therefore, if the detected current is always sampled and held by using a single sampling pulse, the peak value of the charging current cannot necessarily be detected, thereby resulting in an erroneous determination.

In the first embodiment, in order to deal with the problems of the second and third points, the inspection current from the inspection terminal 58 is sampled and held at each sampling timing of the N sampling pulses SP1-0 to SP1-(N−1), as shown in FIG. 4. In this case, the inspection current is the charging current based on the charge stored in the capacitor 54. As shown in FIG. 5B, this charging current is the current value in the peak area of the waveform which differs in wave height depending on the position of the capacitor 54.

In more detail, the N first sample/hold circuits 132-0 to 132-(N−1) shown in FIG. 3 sample the inspection current from the inspection terminal 58 based on the N sampling pulses SP1-0 to SP1-(N−1), respectively, and hold the sampled values. Since the output line of the N first sample/hold circuits 132-0 to 132-(N−1) is a connected common output line, the sum of the held values is obtained from the common output line.

Therefore, the sum of the values sampled and held at the N sampling pulses is approximately the same for the inspection current indicated by the solid line and for the inspection current indicated by the dotted line in FIG. 4, whereby an erroneous determination can be prevented.

In order to deal with the problem of the first point, the second sample/hold circuit 142 shown in FIG. 3 samples and holds the inspection current from the inspection terminal 58 based on the second sampling pulse SP2 shown in FIG. 4. In this case, the inspection current is the discharge current completely discharged from the capacitor 54. As shown in FIG. 5B, this discharge current is the current value in the valley area of the waveform which differs in wave height depending on the position of the capacitor 54.

The output from the common output line of the first sample/hold circuits 132-0 to 132-(N−1) and the output from the second sample/hold circuit 142 are compared by using the comparator 152. The comparator 152 may be formed by using a subtractor, for example.

The peak area and the valley area of the inspection current, which differs in wave height depending on the position of the capacitor 54 shown in FIG. 5B, are compared by comparing the two outputs by using the comparator 152. For example, the difference between the peak area and the valley area is calculated. This eliminates the harmful influence in which the inspection current changes depending on the position of the capacitor 54 (first point).

Figure 7:
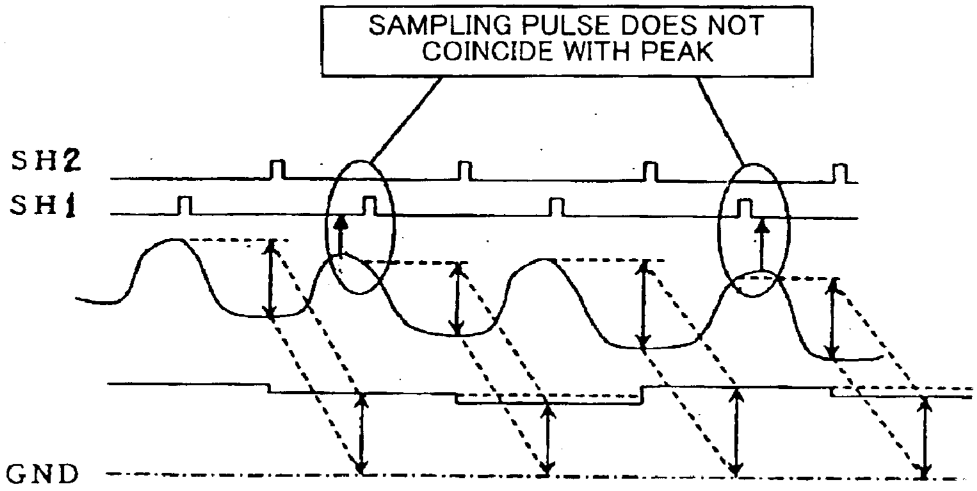
FIG. 7 is a waveform chart showing a comparative example illustrating a harmful influence occurring when sampling an inspection current at one point on a time axis, the inspection current being based on a charge stored in a capacitor.

The peak area of the inspection current is sampled at N points by using the N first sample/hold circuits 132-0 to 132-(N−1) instead of sampling the inspection current at one point. Therefore, a problem which occurs in a comparative example shown in FIG. 7 does not occur in this embodiment. FIG. 7 shows a waveform diagram in which the peak area and the valley area of the inspection current are respectively sampled based on the sampling pulses SP1 and SP2. The peak area and the valley area of the inspection current may be shifted on the time axis due to variation of the on-resistance of the thin film transistor 52. In this case, the sampling pulse SP1 does not necessarily coincide with the peak of the peak area of the inspection current, as shown in FIG. 7. Therefore, the calculation result for the difference between the peak area and the valley area of the sampled inspection current varies even in a normal pixel, as indicated at the bottom of FIG. 7. This results in an erroneous determination.

The output from the comparator 152 is sampled and held by using the third sample/hold circuit 156 according to the third sampling pulse SP3 shown in FIG. 4. This enables the inspection current, from which the harmful influence in which the inspection current changes depending on the position of the capacitor 54 is removed, to be sampled.

The determination circuit 158 determines whether or not the pixel drive cell 50 has a defect by comparing the inspection value of the pixel drive cell 50, which is sequentially input from the third sample/hold circuit 156, with a reference value, for example.

COMPARATIVE EXAMPLE

Japanese Patent Application Laid-open No. 3-200121 discloses an analog test method for a pixel transistor array. This method obtains test results by integrating the current based on the charge stored in the capacitor of each pixel drive cell by using an integration circuit. However, since the integration period is four times greater than the time constant of the pixel drive cell (page 7, upper left column, line 5), this method cannot deal with an increase in speed. Moreover, both the peak area and the valley area of the inspection current are integrated in such a long integration period. However, Japanese Patent Application Laid-open No. 3-200121 does not disclose subtracting the integrated value of the discharge current which changes depending on the load on the inspection current path. Furthermore, since Japanese Patent Application Laid-open No. 3-200121 discloses an analog test method, erroneous determination may occur due to the influence of external noise.

Second Embodiment

Figure 8:
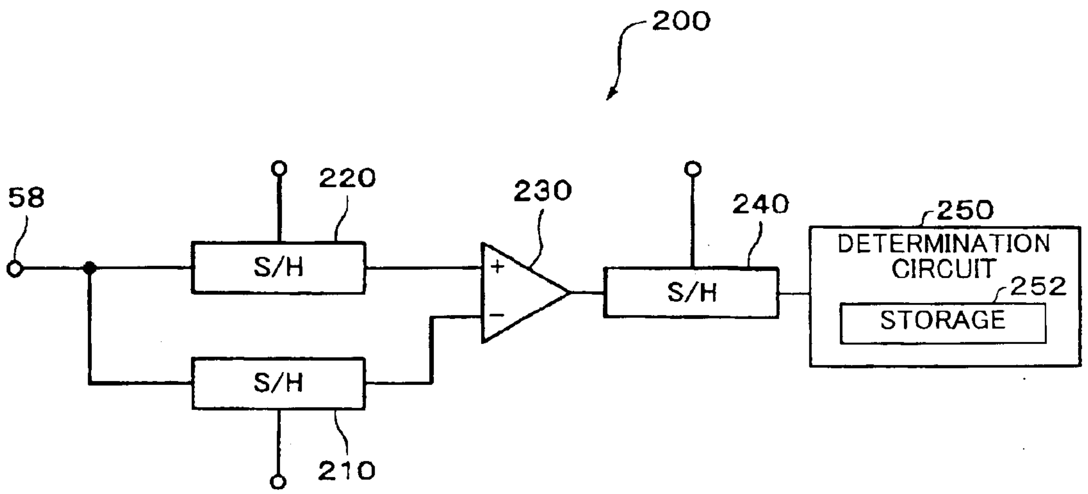
FIG. 8 is a block diagram showing an inspection circuit according to a second embodiment of the present invention.

In a second embodiment of the present invention, an inspection circuit 200 shown in FIG. 8 is used instead of the inspection circuit 120 shown in FIG. 3 used in the first embodiment.

In FIG. 8, the inspection circuit 200 includes a first sample/hold circuit 210, a second sample/hold circuit 220, a comparator 230, a third sample/hold circuit 240, and a determination circuit 250.

The inspection circuit 200 substantially differs in configuration from the inspection circuit 120 in that the inspection circuit 120 shown in FIG. 3 includes the N first sample/hold circuits 132-0 to 132-(N−1) and the inspection circuit 200 shown in FIG. 8 includes one first sample/hold circuit 210. A storage section 252 is provided in the determination circuit 250.

Figure 10:
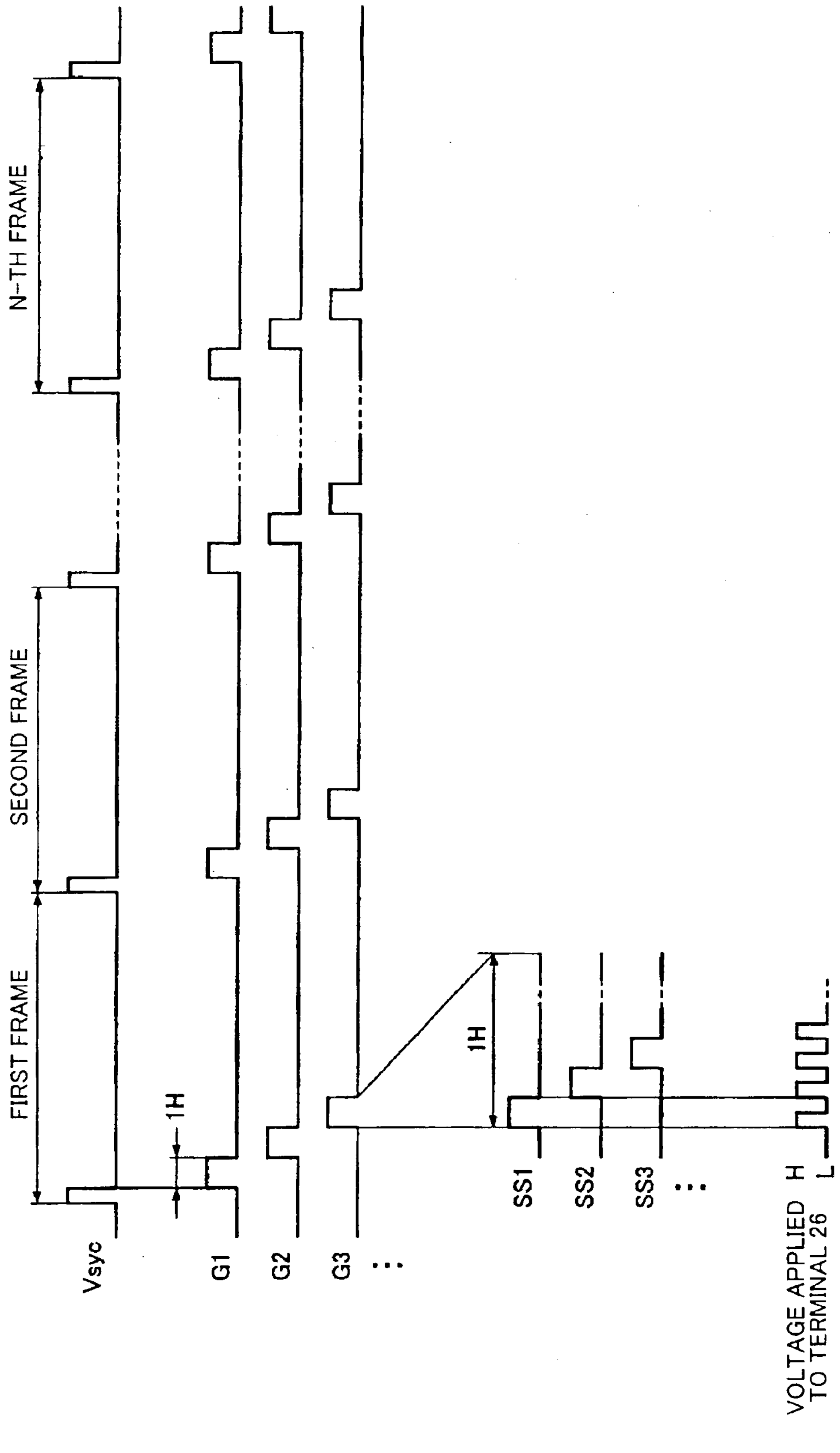
FIG. 10 is a timing chart for illustrating charge and discharge steps in the second embodiment of the present invention.

In the first embodiment, the capacitors 54 of the pixel drive cells 50 are charged and discharged within one vertical scanning period. In the second embodiment in which the inspection circuit 200 shown in FIG. 8 is used, the capacitors 54 of the pixel drive cells 50 are charged and discharged in each of N vertical scanning periods as shown in FIG. 10 (first to Nth frames shown in FIG. 10). The charge and discharge operation in each frame is the same as the charge and discharge operation in the first embodiment.

Figure 9:
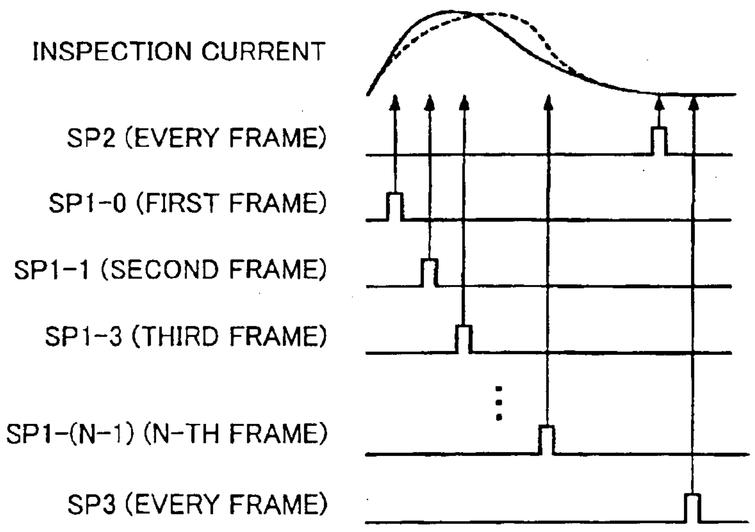
FIG. 9 is a timing chart for illustrating charge and discharge steps in the second embodiment of the present invention.

In the second embodiment, the inspection current is sampled at sampling timing shown in FIG. 9 instead of the sampling timing shown in FIG. 4 in the first embodiment. In FIG. 9, the N first sampling pulses SP1-0 to SP1-(N−1) are generated in different frames (one of the first to Nth frames). In the first embodiment, the inspection current from the pixel drive cell 50 is sampled N times in one frame (one vertical scanning period). In the second embodiment, the inspection current from the pixel drive cell 50 is sampled once in each of the N frames. The second and third sampling pulses SP2 and SP3 are generated in each frame.

Sampling of the inspection current from one pixel drive cell 50 is described below. The inspection current (charging current) from the capacitor 54 charged in the first frame is input to the first sample/hold circuit 210 through the inspection terminal 58. The first sample/hold circuit 210 samples the charging current at the sampling pulse SP1-0 shown in FIG. 9, and holds the sampled value.

The inspection current (discharge current) after the pixel drive cell 50 is discharged is input to the second sample/hold circuit 220 through the inspection terminal 58. The second sample/hold circuit 220 samples the discharge current by using the sampling pulse SP2 shown in FIG. 9, and holds the sampled value.

The comparison circuit 230 compares the outputs from the first and second sample/hold circuits 210 and 220, and outputs the difference between the two outputs. The third sample/hold circuit 240 samples the output from the comparison circuit 230 at the third sampling pulse SP3 shown in FIG. 9, and holds the sampled value. The value held by the third sample/hold circuit 240 is stored in the storage section 252 of the determination circuit 250.

In the second frame, the sampling operation and the like are performed in the same manner as in the first frame except that the sampling timing of the first sample/hold circuit 210 is determined by the first sampling pulse SP1-1 shown in FIG. 3. In the third to Nth frames, the sampling operation and the like are performed in the same manner as in the first and second frames except that the sampling timing of the first sample/hold circuit 210 differs from the sampling timing in the first and second frames.

The inspection values collected in the first to Nth frames for all the pixel drive cells 50 in the active matrix region shown in FIG. 1 are stored in the storage section 252 of the determination circuit 250. The determination circuit 250 determines whether or not the pixel drive cell 50 has a defect based on the information stored in the storage section 252.

The inspection value stored in the storage section 252 is a value obtained by calculating the difference between two values of the inspection current sampled at one point in the peak area (charging current) and one point in the valley area (discharge current). N inspection values are collected for the single pixel drive cell 50 while changing the sampling timing in the peak area of the inspection current.

The determination circuit 250 may determine whether or not the pixel drive cell 50 has a defect by comparing the mean value of the N inspection values for the single pixel drive cell 50 with a reference value. The determination circuit 250 may determine whether or not the pixel drive cell 50 has a defect by comparing the maximum value of the N inspection values for the single pixel drive cell 50 with a reference value. The determination circuit 250 may determine whether or not the pixel drive cell 50 has a defect by comparing the sum of the N inspection values for the single pixel drive cell 50 with a reference value.

The embodiments of the present invention are described above. However, the present invention is not limited to the above-described embodiments. Various modifications and variations are possible within the spirit and scope of the present invention.

In the first and second embodiments, in the case where the horizontal scanning circuit 20 and the vertical scanning circuit 30 are not formed on the active matrix substrate 10, the horizontal scanning circuit 20 and the vertical scanning circuit 30 provided to an external driver or the inspection device 100 or 200 may be used.

In the first and second embodiments, the inspection current is input to the inspection circuit 100 or 200 through the common line 56. However, the detection route of the inspection current is not limited to the common line 56. The common line may not be provided depending on the active matrix substrate. In this case, the charge/discharge circuit 110 and the inspection circuit 120 which are exclusively connected with the signal input terminal 26 through a switch may be provided. In the case where the common line 56 is provided, the charge/discharge circuit 110 and the inspection circuit 120 which are exclusively connected with the inspection terminal 58 through a switch may also be provided using the same method as described above.

The present invention is not necessarily applied to inspection of an active matrix substrate used for a liquid crystal display device. The present invention may be applied to inspection of an active matrix substrate used for other applications insofar as each pixel drive cell includes a pixel select switching element and a capacitor connected with the pixel select switching element.

What is claimed is:

1. A method of inspecting an active matrix substrate in which a plurality of pixel drive cells are arranged in a matrix, each of the pixel drive cells including a pixel select switching element and a capacitor connected to the pixel select switching element, the method comprising:

sequentially charging and discharging the capacitors of the pixel drive cells;

detecting a charging current at different points on a time axis, the charging current being based on charges stored in the capacitors by charging;

detecting a discharge current from the capacitors after discharging; and determining whether or not each of the pixel drive cells has a defect, based on the charging current detected at the different points and the discharge current.

2. The method of inspecting an active matrix substrate as defined in claim 1, wherein the step of detecting the charging current includes adding up charging currents detected at the different points on a time axis.

3. The method of inspecting an active matrix substrate as defined in claim 2, wherein the step of detecting the charging current is performed by using a plurality of first sample/hold circuits driven by a plurality of first sampling pulses which go active at the different points on a time axis.

4. The method of inspecting an active matrix substrate as defined in claim 3, wherein:

the step of detecting the discharge current is performed by using a second sample/hold circuit driven by a second sampling pulse which goes active after discharging; and the determining step includes comparing an output from a common output line of the first sample/hold circuits with an output from the second sample/hold circuit by using a comparison circuit, and sampling an output from the comparison circuit by using a third sample/hold circuit driven by a third sampling pulse which goes active at a timing later than the second sampling pulse.

5. The method of inspecting an active matrix substrate as defined in claim 1, wherein the step of charging and discharging is performed in one vertical scanning period.

6. The method of inspecting an active matrix substrate as defined in claim 1, wherein:

the step of charging and discharging is performed in a plurality of vertical scanning periods;

the step of detecting the charging current is performed at one of the different points in each of the vertical scanning periods;

the step of detecting the discharge current is performed once after discharging in each of the vertical scanning periods; and the determining step includes comparing the charging current with the discharge current in each of the vertical scanning periods.

7. The method of inspecting an active matrix substrate as defined in claim 6, wherein:

the step of detecting the charging current is performed by using a first sample/hold circuit driven by first sampling pulses, the first sampling pulses in the vertical scanning periods being different from each other;

the step of detecting the discharge current is performed by using a second sample/hold circuit driven by a second sampling pulse which is common in the vertical scanning periods; and the determining step includes comparing an output from the first sample/hold circuit with an output from the second sample/hold circuit in each of the vertical scanning periods by using a comparison circuit, and sampling an output from the comparison circuit by using a third sample/hold circuit driven by a third sampling pulse in each of the vertical scanning periods, the third sampling pulse going active at a timing later than the second sampling pulse.

8. The method of inspecting an active matrix substrate as defined in claim 6, wherein the determining step is performed based on a mean value of the comparison results obtained in the vertical scanning periods.

9. The method of inspecting an active matrix substrate as defined in claim 6, wherein the determining step is performed based on a sum of the comparison results obtained in the vertical scanning periods.

10. The method of inspecting an active matrix substrate as defined in claim 6, wherein the determining step is performed based on a maximum value selected from among the comparison results obtained in the vertical scanning periods.

11. The method of inspecting an active matrix substrate as defined in claim 1, wherein the pixel select switching elements are thin film transistors having various on-resistances in manufacturing.

12. A device for inspecting an active matrix substrate in which a plurality of pixel drive cells are arranged in a matrix, each of the pixel drive cells including a pixel select switching element and a capacitor connected to the pixel select switching element, the device comprising:

a charge/discharge circuit which sequentially charges and discharges the capacitors of the pixel drive cells;

a first detection circuit which detects a charging current at different points on a time axis, the charging current being based on charges stored in the capacitors by charging;

a second detection circuit which detects a discharge current from the capacitors after discharging; and a determination circuit which determines whether or not each of the pixel drive cells has a defect, based on the charging current detected at the different points and the discharge current.

13. The device for inspecting an active matrix substrate as defined in claim 12, wherein:

the first detection circuit includes a plurality of first sample/hold circuits driven by a plurality of first sampling pulses which go active at the different points on a time axis;

the second detection circuit includes a second sample/hold circuit driven by a second sampling pulse which goes active after discharging; and the determination circuit includes a comparison circuit which compares an output from a common output line of the first sample/hold circuits with an output from the second sample/hold circuit, and a third sample/hold circuit which is driven by a third sampling pulse which goes active at a timing later than the second sampling pulse and samples an output from the comparison circuit.

14. The device for inspecting an active matrix substrate as defined in claim 12, wherein:

the charge/discharge circuit sequentially charges and discharges the capacitors of the pixel drive cells in each of a plurality of vertical scanning periods;

the first detection circuit includes a first sample/hold circuit driven by first sampling pulses which are different from each other within the vertical scanning periods;

the second detection circuit includes a second sample/hold circuit driven by a second sampling pulse which is common in the vertical scanning periods; and the determination circuit includes a comparison circuit which compares an output from the first sample/hold circuit with an output from the second sample/hold circuit in each of the vertical scanning periods, and a third sample/hold circuit which is driven by a third sampling pulse which goes active at a timing later than the second sampling pulse and samples an output from the comparison circuit in each of the vertical scanning periods.

* * * * *